United States Patent [19]

Wakeling

[11] 4,130,723
[45] Dec. 19, 1978

[54] PRINTED CIRCUIT WITH LATERALLY DISPLACED GROUND AND SIGNAL CONDUCTOR TRACKS

[75] Inventor: Antony J. Wakeling, Fleet, England
[73] Assignee: The Solartron Electronic Group Limited, Farnborough, England
[21] Appl. No.: 843,195
[22] Filed: Oct. 18, 1977
[30] Foreign Application Priority Data
  Nov. 19, 1976 [GB] United Kingdom ............... 48301/76
[51] Int. Cl.² ............................................. H05K 1/02
[52] U.S. Cl. ............................ 174/68.5; 174/117 PC; 333/84 M
[58] Field of Search ......... 174/68.5, 117 FF, 117 PC; 333/84 M; 361/409, 410

[56] References Cited
U.S. PATENT DOCUMENTS

| 3,093,805 | 6/1963 | Osifchin | 174/117 PC |
| 3,459,879 | 8/1969 | Gerpheide | 174/117 FF |
| 3,461,552 | 8/1969 | Wolf | 174/68.5 |
| 3,568,312 | 3/1971 | Perricone | 174/68.5 |
| 3,876,964 | 4/1975 | Balaster et al. | 174/68.5 |

FOREIGN PATENT DOCUMENTS 1590612  4/1970  Fed. Rep. of Germany .......... 174/68.5

Primary Examiner—Laramie E. Askin
Attorney, Agent, or Firm—William R. Sherman; Kevin McMahon; Edward Manzo

[57] ABSTRACT

A printed circuit mother board, for interconnecting the respective edge connectors of a plurality of other printed circuit boards having digital circuitry thereon, has a set of generally straight, approximately parallel tracks on each side. Each set of tracks comprises alternate signal tracks and ground tracks, and the ground tracks of each set are interconnected with each other to approximate to a ground plane. Additionally, the tracks on one side of the board are slightly laterally displaced with respect to the tracks on the other side, so that each signal track on either side is opposite a ground track on the other side. The possibility of interference between signals carried by the signal tracks is thus reduced, and the board has transmission line characteristics.

5 Claims, 2 Drawing Figures

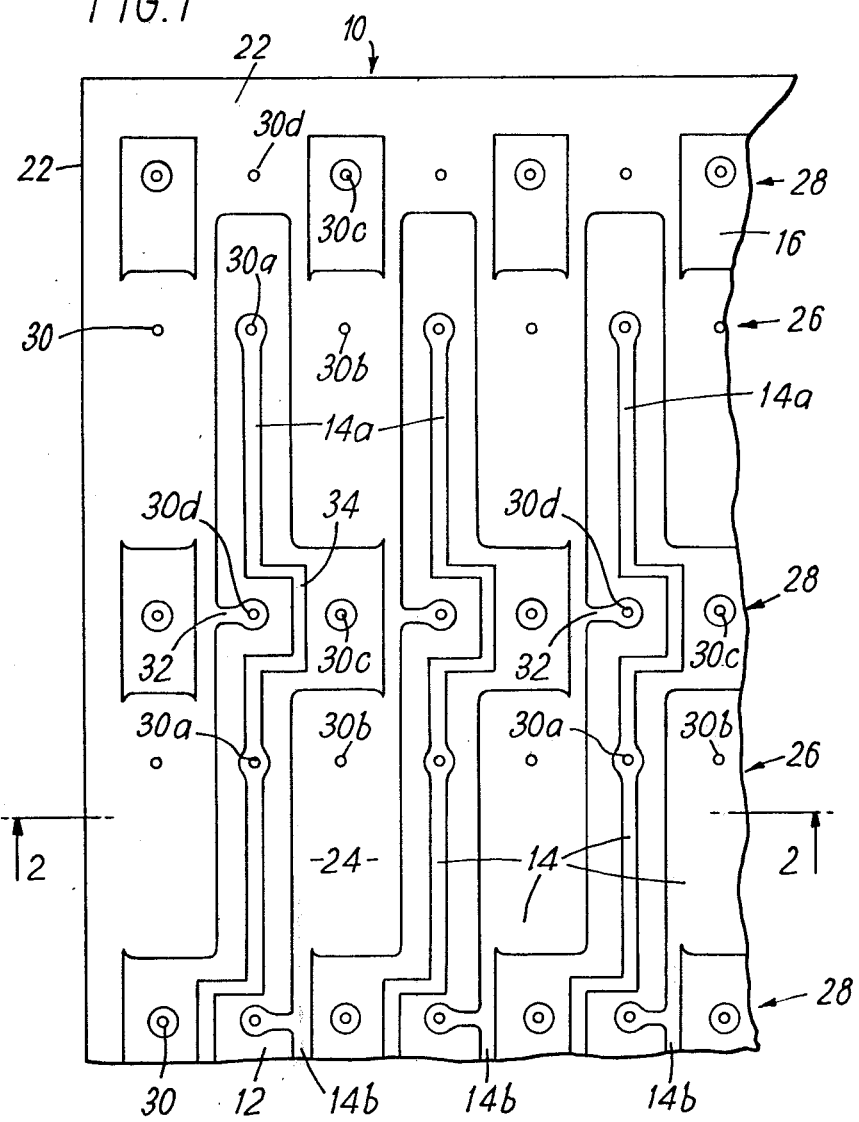
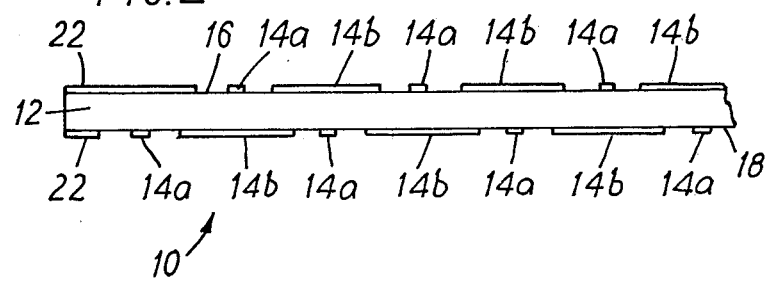

PRINTED CIRCUIT WITH LATERALLY DISPLACED GROUND AND SIGNAL CONDUCTOR TRACKS

This invention relates to printed circuits. In complex electronic apparatus, it is frequently desired to interconnect a plurality of digital circuits, each on a respective printed circuit board, by means of a multi-line data highway. A convenient way of implementing the data highway is as a printed circuit on a so-called printed circuit mother board, into which the edge connectors of the other printed circuit boards are plugged or soldered.

However, the digital signals to be transmitted via such a printed circuit highway typically have a relatively high bit rate, and it is important that they should not be significantly delayed, distorted or attenuated by the highway. It is also important that there should be no interference (or cross-talk) between the respective digital signals carried by the individual lines of the highway.

It is therefore an object of the present invention to provide a printed circuit which is particularly suitable for use as a multi-line signal transmission circuit such as a data highway.

According to the present invention, there is provided a printed circuit adapted for use as a multi-line signal transmission circuit, the printed circuit comprising: a double-sided support made from an electrically insulating material; a first set of printed circuit tracks on one side of the support; and a second set of printed circuit tracks on the other side of the support; each set of tracks including alternate signal tracks and ground tracks disposed side by side; and the signal tracks and ground tracks on said one side of the support being disposed substantially opposite the ground tracks and signal tracks respectively on the other side of the support.

In a preferred embodiment of the invention, all the respective ground tracks of each set are electrically connected to each other on the support, whereby they approximate to a ground plane.

Additionally, at least one ground track of the first set is preferably electrically connected on the support to at least one ground track of the second set, for example by means of at least one plated-through hole in the support. Advantageously, all the ground tracks of each set are laterally interconnected at a plurality of points along their length via plated through holes and the ground tracks of the other set.

Conveniently, all the trakcs are generally straight and substantially parallel to each other.

Advantageously, the ground tracks are of greater area than the signal tracks.

Preferably, the support is substantially a rigid board, made, for example, from resin-bonded glass fibre.

The invention will now be described, by way of example only, with reference to the accompanying drawings, of which:

FIG. 1 is a plan view of part of a printed circuit board in accordance with the present invention; and FIG. 2 is a sectional view on the line 2—2 of the printed circuit board shown in FIG. 1.

The printed circuit board shown in FIGS. 1 and 2 is indicated generally at 10, and is intended for use as a mother board for interconnecting a plurality of digital circuits on other printed circuit boards (not shown). The board 10 comprises an electrically insulating support 12, typically made from resin-bonded glass fibre, and a plurality of generally straight, substantially parallel and substantially uniformly spaced printed circuit tracks 14 formed on both sides 16, 18 of the support 12 by any convenient process, e.g. by depositing copper all over both sides of the support 12, printing the desired configuration of the tracks 14 on the copper with an etch-resistant ink, and etching away the parts of the copper not covered by the ink.

The tracks 14 comprise, on each of the sides 16, 18 of the support 12, alternate signal tracks 14a and ground tracks 14b. As can best be seen in FIG. 2, the signal tracks 14a on the side 16 of the support 12 are disposed substantially opposite the ground tracks 14b on the side 18, while the ground tracks 14b on the side 16 are disposed substantially opposite the signal tracks 14a on the side 18, i.e. the tracks on the side 16 are effectively displaced sideways by one track spacing distance with respect to the tracks on the side 18, so that if the sides 16 and 18 are regarded as upper and lower sides respectively, each signal track 14a on the side 16 is above a ground track 14b on the side 18, while each ground track 14b on the side 16 is above a signal track 14a on the side 18.

The opposite ends of each ground track 14b on the side 16 connect with a peripheral track 22, which extends entirely round the periphery of the support 12, while a similar peripheral track connects together the opposite ends of all the ground tracks 14b on the side 18. Thus all the ground tracks 14b on the side 16 are connected together on the support 12, and all the ground tracks 14b on the side 18 are also connected together on the support 12.

The signal tracks 14a are typically 0.015 inch in width, while the ground tracks 14b include uniformly spaced portions, such as that indicated at 24, of increased width, typically 0.115 inch, joined by short portions of the same width as the tracks 14a.

As already mentioned, the board 10 is intended for use as a mother board to interconnect a plurality of digital circuits on other printed circuit boards. To this end, the board 10 includes a plurality of pairs of parallel lines 26, 28 of uniformly spaced plated-through holes 30, the holes of each pair of parallel lines being spaced to receive the pins of a respective edge connector socket (not shown) into which a respective one of the other printed circuit boards can be plugged. Thus the other printed circuit boards, when plugged into their respective sockets, are parallel to each other and extend perpendicularly to the board 10. Corresponding alternate holes 30a of each line 26 are each formed in and electrically connected to a respective signal track 14a on the side 16 of the support 12, while the other holes 30b of each line 26 are each formed in and electrically connected to a respective ground track 14b on the side 16: these holes 30b are also each electrically connected by a respective short laterally extending spur track (not shown) on the side 18 to a respective ground track 14b on the side 18, the spur tracks being necessitated by the aforementioned lateral displacement of the tracks 14b on the side 16 with respect to the tracks 14b on the side 18. In a similar manner, corresponding alternate holes 30c of each line 28 are each formed in and electrically connected to a respective signal track 14a on the side 18 of the support 12, while the other holes 30d of each line 28 are each formed in and electrically connected to a respective ground track 14b on the side 18: the holes 30d are also each electrically connected by a respective short laterally extending spur track 32 on the side 16 to a respective ground track 14b on the side 16.

All the spur tracks 32 on the side 16 associated with the holes 30d of alternate pairs of the lines 26, 28 extend in one lateral direction, while all the other spur tracks 32 on the side 16 extend in the other lateral direction. The spur tracks on the side 18 and the holes 30b are similarly arranged. Thus the spur tracks serve to laterally interconnect all the ground tracks 14b on both sides of the support.

Since all the holes 30a in any given signal track 14a on the side 16 are aligned not only with each other but also with a plurality of the holes 30d, each signal track includes portions, such as that shown at 34, which are laterally diverted to pass around the holes 30d. The signal tracks 14a on the side 18 include similar diverted portions to pass around the holes 30b.

It will thus be appreciated that, in use, each of the signal tracks 14a serves to interconnect all the corresponding pins of the aforementioned edge connector sockets, so that if, for example, each socket has pins A, B, C, ..., the signal tracks 14a constitute a data highway by which all the pins A are connected together, all the pins B are connected together, all the pins C are connected together, and so on.

The possibility of interference between the respective signals carried, in use, by the respective signal tracks 14a of this data highway is substantially reduced both by the presence of a respective ground track 14b between each adjacent pair of the signal tracks 14a on the side 16 or on the side 18 of the support 12, and by the aforementioned lateral displacement of the tracks on the side 16 with respect to those on the side 18.

Additionally, the disposition and interconnection of the ground tracks 14b on both sides of the support makes them approximate to respective interconnected ground planes, and thus gives the data highway constituted by the signal tracks 14a transmission characteristics approximating to those of a screened transmission line. In particular, the tracks widths and spacings are chosen such that together with the distributed capacitance of the edge connector sockets, the data highway approximates to a transmission line having a characteristic impedance of typically 80 ohms.

The support 12 can, of course, include further printed circuit tracks in addition to those described above, in particular power supply tracks. These can conveniently be provided on a respective area of each side of the support to one side of the areas occupied by the signal tracks 14a and the ground tracks 14b.

Several modifications can be made to the described embodiment of the invention. For example, the support 12 can be of the elongated flexible type having a plug and socket at the opposite ends thereof, the tracks serving as a data highway between the plug and socket.

What is claimed is:

1. A printed circuit for use as a multi-line signal transmission circuit comprising:
   a double-sided support made from an electrically insulating material;
   a first set of printed circuit tracks on one side of the support; and
   a second set of printed circuit tracks on the other side of the support;
   each set of tracks including alternate signal tracks and ground tracks disposed side by side;
   the signal tracks and ground tracks on said one side of the support being disposed substantially opposite the ground tracks and signal tracks respectively on the other side of the support;
   substantially all the respective ground tracks of each set being electrically interconnected at a plurality of points along their length via plated through holes to the ground tracks of the other set.

2. A printed circuit as claimed in claim 1, wherein all the tracks are generally straight and substantially parallel to each other.

3. A printed circuit as claimed in claim 1, wherein the ground tracks are of greater area than the signal tracks.

4. A printed circuit as claimed in claim 1, wherein the support is a substantially rigid board.

5. A printed circuit as claimed in claim 4, wherein said board is made from resin-bonded glass fibre.